US009874600B2

(12) United States Patent
Yehle et al.

(10) Patent No.: US 9,874,600 B2
(45) Date of Patent: Jan. 23, 2018

(54) METHOD AND APPARATUS FOR AUTOMATED SURGE STRESS TESTING OF A DEVICE UNDER TEST USING VOLTAGE AND CURRENT WAVEFORMS

(71) Applicant: Texas Instruments Incorporated, Dallas, TX (US)

(72) Inventors: Joseph Milton Yehle, Dallas, TX (US); James Henry McGee, Jr., Rowlett, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 98 days.

(21) Appl. No.: 14/939,484

(22) Filed: Nov. 12, 2015

(65) Prior Publication Data

US 2017/0139000 A1     May 18, 2017

(51) Int. Cl.
*G01R 31/00* (2006.01)
*G01R 31/28* (2006.01)
*G01R 31/30* (2006.01)
*G01R 1/04* (2006.01)

(52) U.S. Cl.
CPC ..... *G01R 31/2834* (2013.01); *G01R 31/3004* (2013.01); *G01R 1/0408* (2013.01)

(58) Field of Classification Search
CPC .......... G06F 3/015; G06F 3/016; G06F 3/043; G06F 3/03547; G06F 3/038; G06F 3/0383; H01L 29/78603; H01L 31/0725; G01R 31/1272; G01R 31/001; G01R 31/1227; G01R 31/343; G01R 29/12; G01R 31/021; G01R 31/2827; G01R 31/3191; G01R 31/31924; G01R 31/346; G01N 27/025; G01N 29/11; H01R 24/42
See application file for complete search history.

(56) References Cited

U.S. PATENT DOCUMENTS

| | | | | |
|---|---|---|---|---|
| 5,111,149 A | * | 5/1992 | Lebesch | G01R 31/06 324/546 |
| 5,519,327 A | * | 5/1996 | Consiglio | G01R 31/002 324/602 |
| 5,633,801 A | * | 5/1997 | Bottman | G01R 27/02 324/600 |

OTHER PUBLICATIONS

Pearson Current Monitor Model 110; Pearson Electronics, Inc., Palo Alto, CA; 110.SPX-990506; obtained from the Internet Oct. 31, 2015; www.pearsonelectrics.com; 1 pg.
MIG2403, Insulation Tester According to IEC 60060-1; 1.2/50 up to 24kV; EMC Partner AG, Switzerland; obtained from the Internet Oct. 31, 2015; http://www.emc-partner.com/product-categories/component-testing/insulation-test-syste . . . ; 5 pgs.

(Continued)

*Primary Examiner* — Vinh Nguyen
(74) *Attorney, Agent, or Firm* — Jacqueline J. Garner; Charles A. Brill; Frank D. Cimino

(57) ABSTRACT

Surge testing systems and methods to surge test a device under test (DUT) in which a host computer controls a pulse generator and an oscilloscope to automatically apply a high voltage pulse from the pulse generator through a current limiter to the DUT, the oscilloscope provides one or more current or voltage waveforms representing a voltage or current associated with the DUT and/or the pulse generator, and the host computer determines a pass or fail condition of the DUT for the applied high voltage pulse according to the waveform or waveforms.

20 Claims, 5 Drawing Sheets

(56) References Cited

OTHER PUBLICATIONS

Digital Storage Oscilloscopes, TDS2000C Series Datasheet; Tektronix; obtained from the Internet Oct. 31, 2015; tektronix.com; 12pgs.
Tektronix P6015A High Voltage Probe; TestEquity; obtained from the Internet Oct. 31, 2015; http://www.testequity.com/productprint/577/; 2 pgs.
Passive High-Voltage Probes, P5100A, TPP0850, P5122, P5150, P6015A Data Sheet; Tektronix; obtained from the Internet Oct. 31, 2015; www.tektronix.com; 4 pgs.
Instruction Manual, Tektronix P6015A, 1000X High Voltage Probe, 070-8223-05; Tektronix; obtained from the Internet Oct. 31, 2015; www.tektronix.com; 74 pgs.

* cited by examiner

METHOD AND APPARATUS FOR AUTOMATED SURGE STRESS TESTING OF A DEVICE UNDER TEST USING VOLTAGE AND CURRENT WAVEFORMS

TECHNICAL FIELD

The present disclosure relates to production testing for electrical components and systems.

BACKGROUND

Surge testing is used to verify high-voltage withstanding capabilities of electronic components, and involves application of a high voltage pulse or a series of high voltage pulses to a device under test (DUT). Surge testing is typically done to meet industry specifications, for example, International Electrotechnical Commission (IEC) specification 60747-5-2, Association of Electrical, Electronics, and Information Technologies (VDE) certificate DIN V VDE V 0884-10, etc., where the surge stress waveform shape and test conditions are defined by IEC 60065-1. Thus far, surge testing has been done to sort parts into passed or failed categories based on metrics provided from the surge generator equipment or tool. In one example, the surge generator provides a peak current or "Ipeak" measurement value defined as the highest current consumed by the DUT during the stress. Using this value, a threshold comparison was performed of the Ipeak value for a given DUT, and if the threshold was exceeded, the part was deemed to have failed the surge test. However, this Ipeak measurement value is not adequately stable or repeatable for process control in which there is no tolerance for false pass or false fail identifications, and thus tool specific characterization is required to determine applicable fail limits and correlation, if any, to the IEC or other specifications. Furthermore, different pulse generator manufacturers provide different output parameters, and a given test set up is specific to the pulse generator equipment. Consequently, even where the pulse generator tool is adequately characterized, false failures are common due to the fundamental lack of good repeatability and reliability of the Ipeak measurement or other tool-specific metric. Uncertainty in the tool-specific pass/fail metric requires use of ancillary verification equipment and process steps in order to determine whether a suspected part has indeed failed. For example, a part that yields an excessive Ipeak measurement in one test set up is subsequently taken off-line and subjected to an isolation resistance test using a different piece of equipment and/or the suspected part undergoes further parametric and functional automatic test equipment procedures. This lack of certainty therefore increases testing time and production costs, and largely renders the procedure unsuitable for testing 100% of the devices being produced. Moreover, replacement or upgrading to a different pulse generator tool requires recharacterization of the entire test procedure and system set up.

SUMMARY

Disclosed examples include automated test systems having a pulse generator to provide a high voltage pulse to a device under test in a test fixture, a current limiter connected between the pulse generator and the test fixture, and a voltage sensor to provide a voltage sensor output signal representing a DUT voltage. The pulse generator includes a voltage output to provide a pulse generator voltage output signal representing a voltage of the applied high voltage pulse. The system includes an oscilloscope that generates a first voltage waveform representing the voltage of the applied high voltage pulse according to the pulse generator voltage output signal, and a second voltage waveform representing the DUT voltage according to the voltage sensor output signal. A processor determines a pass or fail condition of the DUT for the applied high voltage pulse according to the first and second voltage waveforms. In certain examples, the host processor identifies the DUT as failing the surge test if the first and second voltage waveforms are dissimilar. In some examples, the DUT is identified as failing if the absolute value of the DUT voltage waveform is greater than a threshold value within a predetermined time after the start of the applied high voltage pulse. In other examples, the processor identifies the DUT as failing if the absolute value of the applied high voltage pulse is less than a threshold value within a predetermined time after the start of the applied high voltage pulse.

In certain embodiments, the system further includes a current sensor to provide a current sensor output signal representing a DUT current, and the pulse generator includes a current output to provide a pulse generator current output signal representing current flow at the pulse generator. The oscilloscope generates a first current waveform according to the current sensor output signal, and generates a second current waveform according to the pulse generator current output signal. The processor determines the DUT pass or fail condition according to at least one of the first and second current waveforms. In certain examples, the host processor identifies the DUT as failing if the absolute value of the first current waveform is greater than a non-zero threshold more than a predetermined time after the start of the applied high voltage pulse. In further examples, the host processor identifies the DUT as failing if the absolute value of the second current waveform is greater than a non-zero threshold value more than a predetermined time after the start of the applied high voltage pulse.

In certain embodiments, the host processor controls the pulse generator to provide the applied high voltage pulse to the DUT, and controls the oscilloscope to obtain the waveforms during the applied high voltage pulse.

Other disclosed examples include surge testing methods and non-transitory computer readable mediums with computer executable instructions for implementing a surge testing method. The example methods include use of a processor to receive from an oscilloscope, at least one waveform that represents a voltage or current associated with a DUT and/or a pulse generator during the applied high voltage pulse. In addition, the processor is used to determine a pass or fail condition of the DUT according to the at least one waveform.

DETAILED DESCRIPTION

Figure 1:
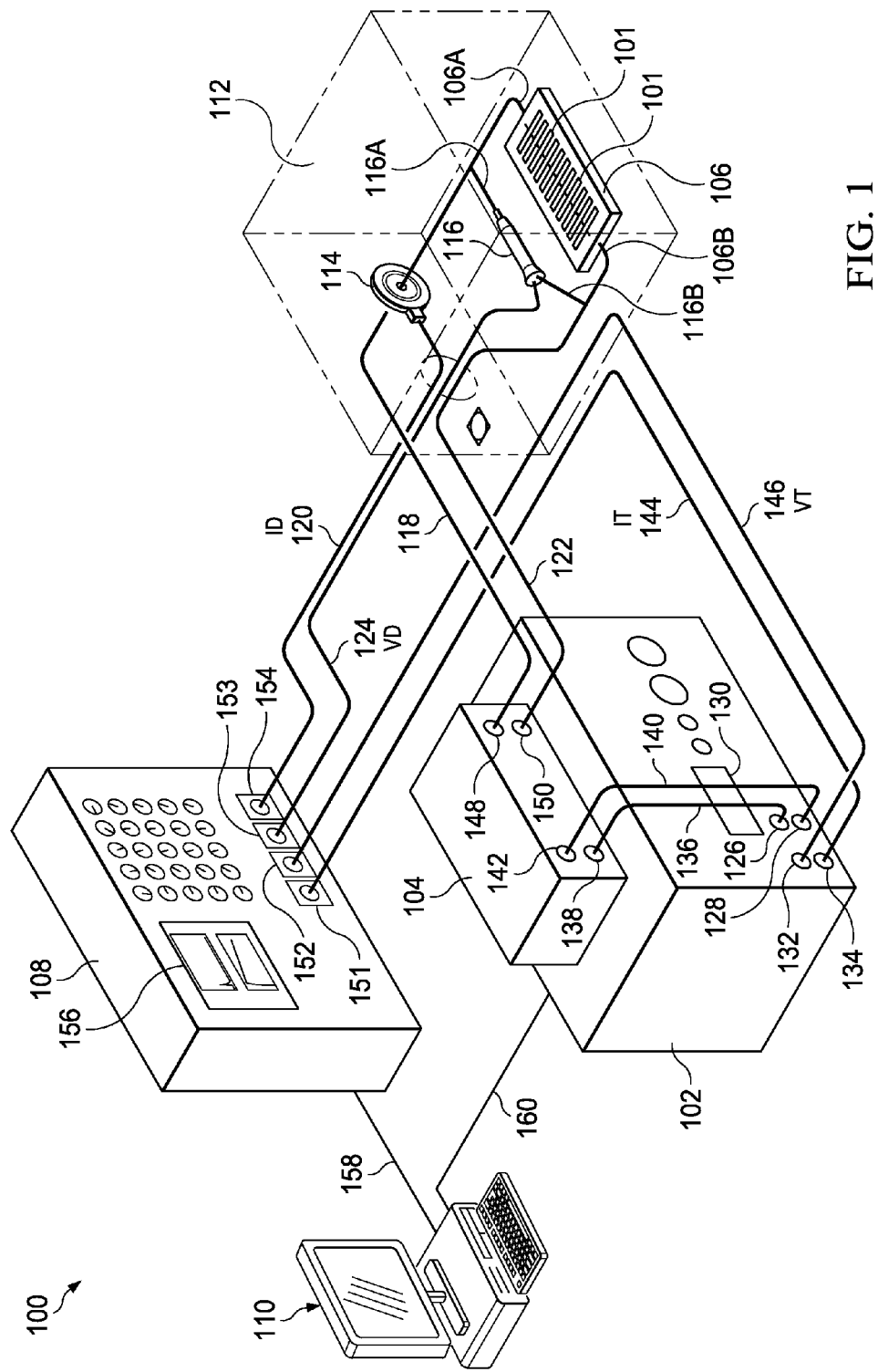
FIG. 1 is a system diagram illustrating an automated surge testing system using waveform analysis to identify passage or failure of one or more devices under test.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical connection or combinations thereof. For example, if a first device couples to or is coupled with a second device, that connection may be through a direct electrical connection, or through an indirect electrical connection via one or more intervening devices and connections.

FIG. 1 illustrates an automated production surge stress testing system 100 for testing reinforced isolation products or other devices under test (DUTs). In one non-limiting example, the system 100 is used for automated surge testing of one or more DUTs through application of one or more positive high voltage pulses followed by one or more negative high voltage pulses pursuant to IEC specification 60747-5-2 and Association of Electrical, Electronics, and Information Technologies (VDE) certificate DIN V VDE V 0884-10 requirements. Other test systems within the scope of the present disclosure can be used for any suitable surge testing according to other applicable specifications and standards. The system 100 includes a surge pulse generator tool 102, a current limiter 104, a test fixture 106, an oscilloscope 108, and a host computer 110. The test fixture 106 includes ten sockets 101 to accommodate 10 DUTs in one example, although other embodiments are possible using a test fixture 106 accommodating any suitable number of one or more DUTs for surge testing in the system 100. The test fixture 106 is housed within, or at least partially covered by, a transparent protective cover structure 112 including one or more holes or openings to accommodate cables for surge test pulse application to the test fixture 106 and for cables to connect voltage and current sensors with the oscilloscope 108.

The test fixture 106 includes first and second test fixture connections 106A and 106B for electrical interconnection of the test fixture 106 and the DUTs thereof with cables for applying surge test pulses and for sensing DUT voltages and currents. Within the cover structure 112 in one example is a current sensor 114 and a high-voltage probe or voltage sensor 116. The current sensor 114 in one example is a Pearson Electronics current monitor model 110, which surrounds a first fixture power cable 118 electrically coupled from the current limiter 104 to the first test fixture connection 106A. The current sensor 114 provides a DUT current sensor signal ID to the oscilloscope 108 through a first sensor cable 120, representing current flowing in the cable 118, and thus current flowing in the tested DUT or DUTs. A second fixture power cable 122 is connected from the current limiter 104 to the second test fixture connection 106B. The high-voltage current probe 116 includes connections 116A and 116B respectively connected to the first and second test fixture connections 106A and 106B to sense the applied voltage at the test fixture 106, and hence to sense the DUT applied voltage. The voltage sensor 116 is connected via a cable 124 to provide a DUT voltage signal VD to another channel of the oscilloscope 108.

Any suitable surge generator tool 102 can be used in the system 100, and the system 100 implements waveform analysis facilitating changing the tool 102. The pulse generator tool 102 in one example is an EMC Partner surge generator model MIG2403. The tool 102 includes first and second (e.g., plus and minus) pulse output connections 126 and 128, respectively, which may be provided on a front panel of the tool 102 as shown, or may be rear panel connections in other examples. In various embodiments, the tool 102 can have the outputs 126, 128 on the front, top, or rear. In one example for a MIG2403 pulse generator, the outputs 126 and 128 are on the top. The first output connection 126 is connected by a cable 136 to a first (e.g., plus) input connection 138 of the current limiter apparatus 104. The second tool output connection 128 is connected by a cable 140 to a second (e.g., minus) input connection 142 of the current limiter 104. In addition, the pulse generator tool 102 in one example includes various front panel indicators and a display screen 130, as well as a current output connection 132 and a voltage output connection 134. The current output connection 132 of the pulse generator tool 102 provides a signal IT representing the output current applied by the tool 102 to another channel of the oscilloscope 108 through a cable 144, and the voltage output connection 134 provides a signal VT representing the output voltage applied by the tool 102 to the oscilloscope 108 through a cable 146.

The current limiter 104 includes a first current limiter output connection 148 and a second current limiter output connection 150. The output connections 148 and 150 are connected to the first and second test fixture connections 106A and 106B via the cables 118 and 122, respectively. The current limiter apparatus 104 is thus electrically connected between the outputs 126, 128 of the pulse generator tool 102 and the test fixture 106. In operation, the current limiter 104 prevents over current conditions in the test fixture 106 to protect the fixture 106 and the electrical connections 106A and 106B thereof, as well as to protect the current sensor 114 and the voltage probe 116.

The oscilloscope 108 in one non-limiting example is a Tektronix TDS 2024C, although any suitable single or multi-channel oscilloscope 108 can be used in other embodiments. In this example, the oscilloscope 108 includes a first channel input connection 151 to receive the tool voltage signal VT through the cable 146, and a second channel input connection 152 to receive the tool current signal IT through the cable 144. In addition, the oscilloscope 108 in this example includes a third channel input connection 153 to receive the DUT voltage signal VD through the cable 124 as well as a fourth channel input connection 154 to receive the DUT current signal ID through the cable 120. The oscilloscope 108 also includes a graphical display 156 which can be used to monitor one or more of the DUT and tool signal waveforms VD, VT, ID and/or IT. The host computer 110 controls both the oscilloscope 108 and the surge generator tool 102 via suitable industry-standard communication interfaces through cables 158 and 160, respectively. In addition, the host computer 110 includes one or more processors (not shown) programmed to implement various automated test program instructions stored in an electronic memory or other non-transitory computer readable medium thereof (not shown). In particular, the host computer 110 is programmed to control the pulse generator tool 102 to apply one or more voltage pulses through the current limiter 104 to the DUT or DUTs on the test fixture 106, and the computer 110 obtains voltage and current signal waveforms associated with the DUT(s) and the tool 102 from the oscilloscope 108.

The computer 110 analyzes the signal waveforms obtained during such applied surge pulses and automatically determines whether or not the tested DUT or DUTs pass or fail the surge test. In this manner, the system 100 provides automated surge testing for one or more devices independent of the particular model or brand of surge generator tool 102, and advantageously provides a single test step suitable for production testing of a large number of DUTs. In addition, the use of waveform analysis in the system 100 advantageously reduces or avoids the number of false negative test results, and the corresponding need for further off-line verification testing, thus allowing use of the system 100 to test large batches of devices while enhancing production yield through avoidance of unnecessary scrap, and reducing production cost by avoiding off-line verification testing.

Figure 2:
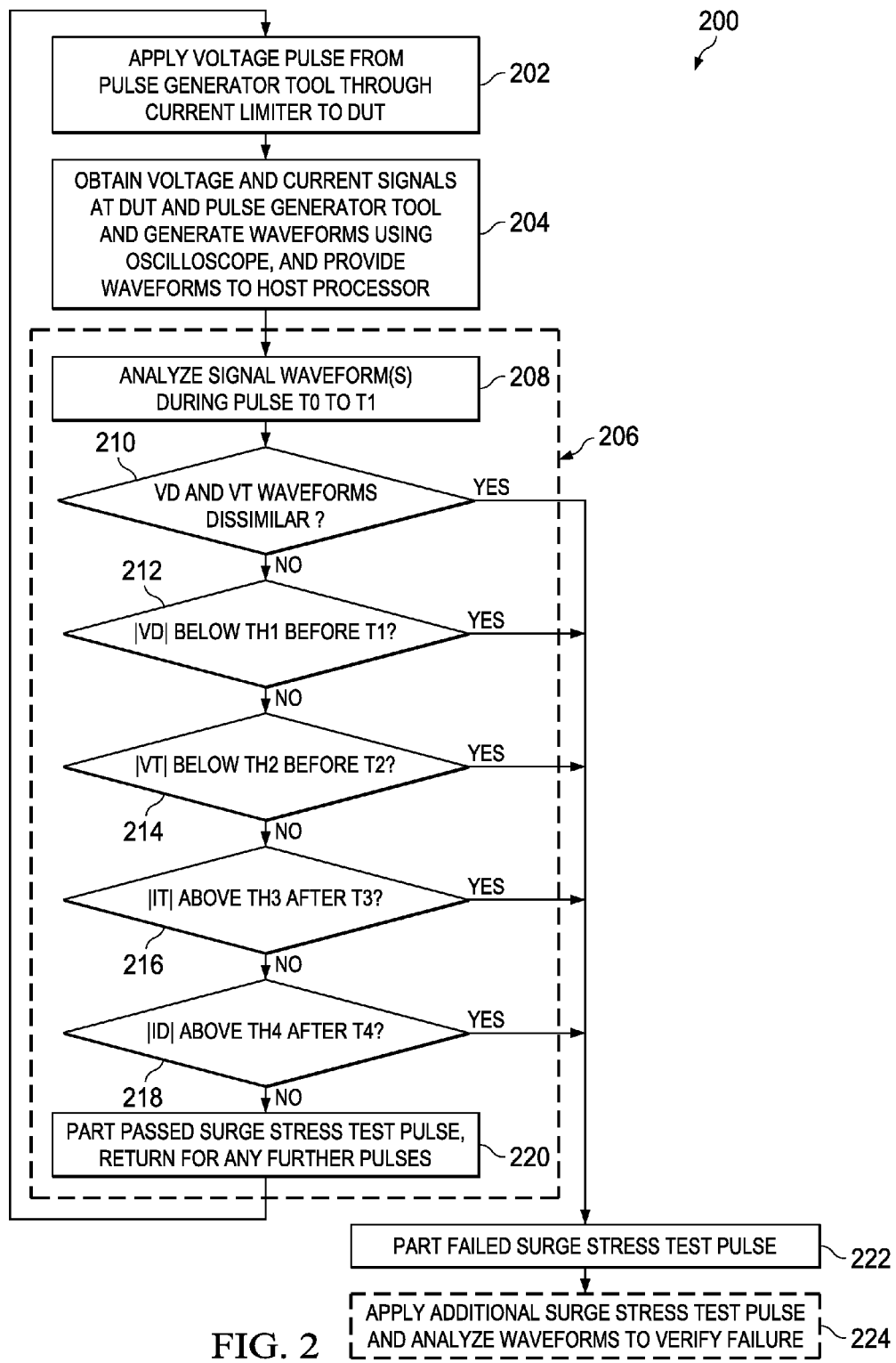
FIG. 2 is a flow diagram illustrating a method of automated surge testing.

Referring also to FIG. 2, a process or method 200 is illustrated for surge testing a DUT, which can be implemented in one example by the host processor 110 in the system 100. Although the method 200 is illustrated and described as a series of acts or events, the methods of the present disclosure are not limited by the illustrated ordering of such acts or events except as specifically set forth herein. Except as specifically provided hereinafter, some acts or events may occur in different order and/or concurrently with other acts or events apart from those illustrated and described herein, and not all illustrated steps may be required to implement a process or method in accordance with the present disclosure. The illustrated methods may be implemented in hardware, processor-executed software or processor-executed firmware, programmable logic, etc. or combinations thereof, and various embodiments or implementations include non-transitory computer readable mediums having computer-executable instructions for performing the illustrated and described methods. For example, an electronic memory (not shown) in the host computer 110 can be used to store computer executable instructions that are executed by a processor of the computer 110 to implement the process 200 of FIG. 2. In this regard, the host computer 110 of FIG. 1 is operatively connected by cables 158 and 160 to control and interact with the oscilloscope 108 and the pulse generator tool 102. In one example, the computer 110 exchanges data and messaging with the oscilloscope 108 and the pulse generator 102 in order to cause the pulse generator 102 to provide one or more high voltage pulses to the DUT in the test fixture 106 in an automated production testing set up. The system 100 and process 200 can be used with any type or form of DUT, including without limitation integrated circuits, electrical circuit components, circuit boards, or other electronic devices or systems.

The test procedure may include multiple high voltage pulses applied in sequence, with the host computer 110 obtaining and analyzing waveforms generated by the oscilloscope 108 between applied high voltage pulses to make a determination as to a pass or fail condition of a tested DUT or group of DUTs according to one or more waveforms. As previously noted, the pulse generator 102 may internally generate a value or number, such as a peak current value "Ipeak" or other metric pertaining to a current or voltage applied by the pulse generator 102 during a test pulse, but such metrics are specific to individual pulse generator devices 102, and can vary from one pulse generator manufactured to another. Moreover, characterizing a relationship or correlation between such pulse generator tool internal metrics and passage or failure of a standardized (e.g., IEC) test is difficult and time-consuming, and the lack of such a correlation has thus far led to an elevated number of false failure identifications, requiring subsequent (e.g., off-line) verification testing. The system 100 and the process 200 advantageously facilitate automated testing with the host computer processor 110 determining surge test pass or fail conditions for a given DUT based on one or more waveforms obtained from the pulse generator voltage or current outputs 132, 134 and/or the current and voltage sensors 114, 116 at the test fixture 106. The waveform-based analysis and pass/fail determination is thus correlated with the applied high voltage pulse controlled by the IEC or other relevant specifications or standards. Accordingly, the method 200 is repeatable and portable with respect to pulse generator tools 102 that are compliant with the IEC specifications.

The process 200 of FIG. 2 begins at 202 with the host processor 110 controlling application of a high voltage pulse from the pulse generator tool 102 through the current limiter 104 to the DUT at the test fixture 106. In one example, the host computer 110 provides one or more control signals or messages via the interconnection 160 in order to cause the pulse generator 102 to generate and apply the high voltage pulse via the pulse output connections 126 and 128 through the current limiter 104, to the DUT or DUTs at the test fixture 106. In one example, a high voltage surge test pulse in the range of 10 kV-24 kV is applied at 202 according to waveform specifications set forth in IEC 60065-1, although high voltage test pulses of any given amplitude and duration are possible in various embodiments. The host computer 110 in one example performs the process 200 for multiple applied high voltage pulses, such as 25 pulses in a positive direction and 25 pulses in a negative direction, with intervening waveform analysis and pass/fail determinations for a given single DUT or set of multiple DUTs in the test fixture 106.

At 204, the oscilloscope 108 receives one or more voltage and/or current signals from the pulse generator signal outputs 132 and 134 and/or from one or both of the test fixture sensors 114 and 116, generates corresponding waveforms, and provides one or more waveforms to the host computer processor 110.

Figure 3:
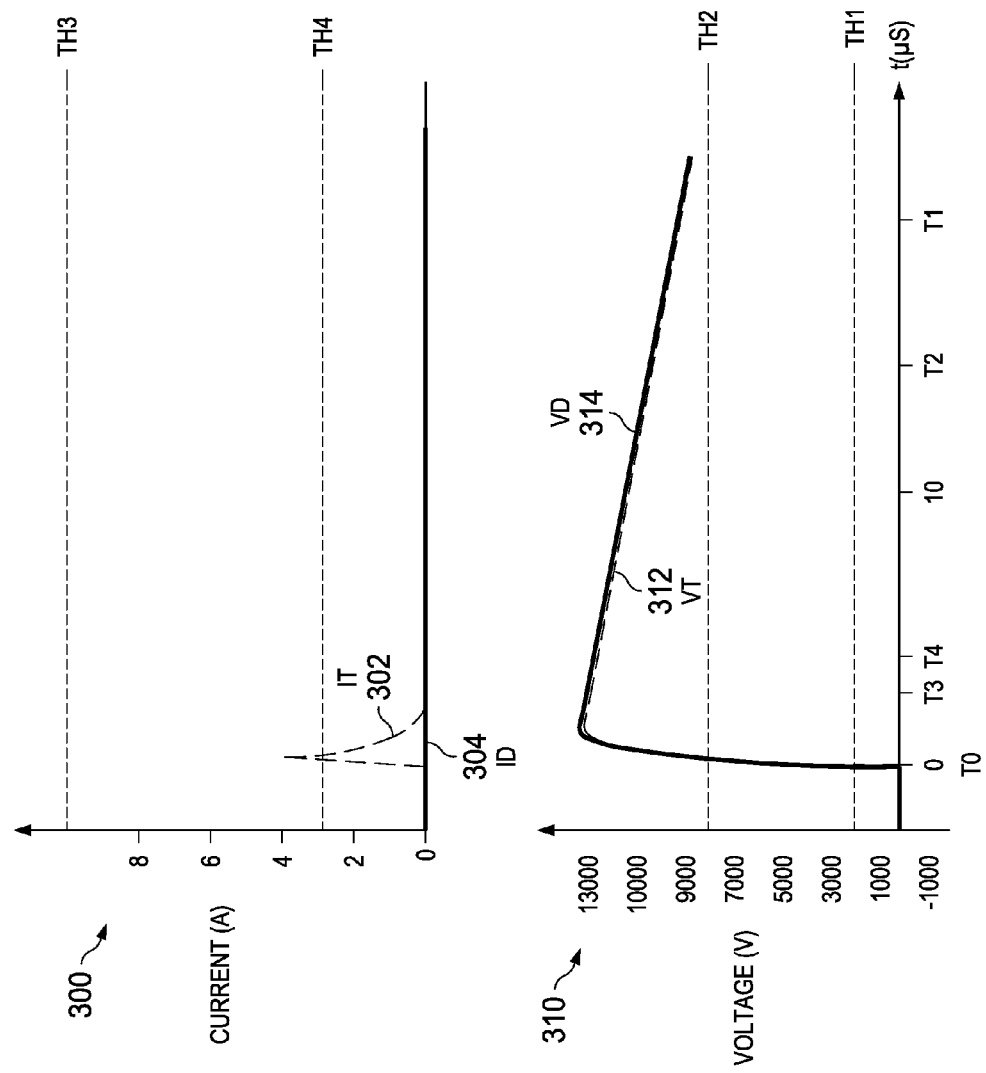
FIG. 3 is a waveform diagram of DUT and tool voltage and current waveforms for a passing DUT.
Figure 4:
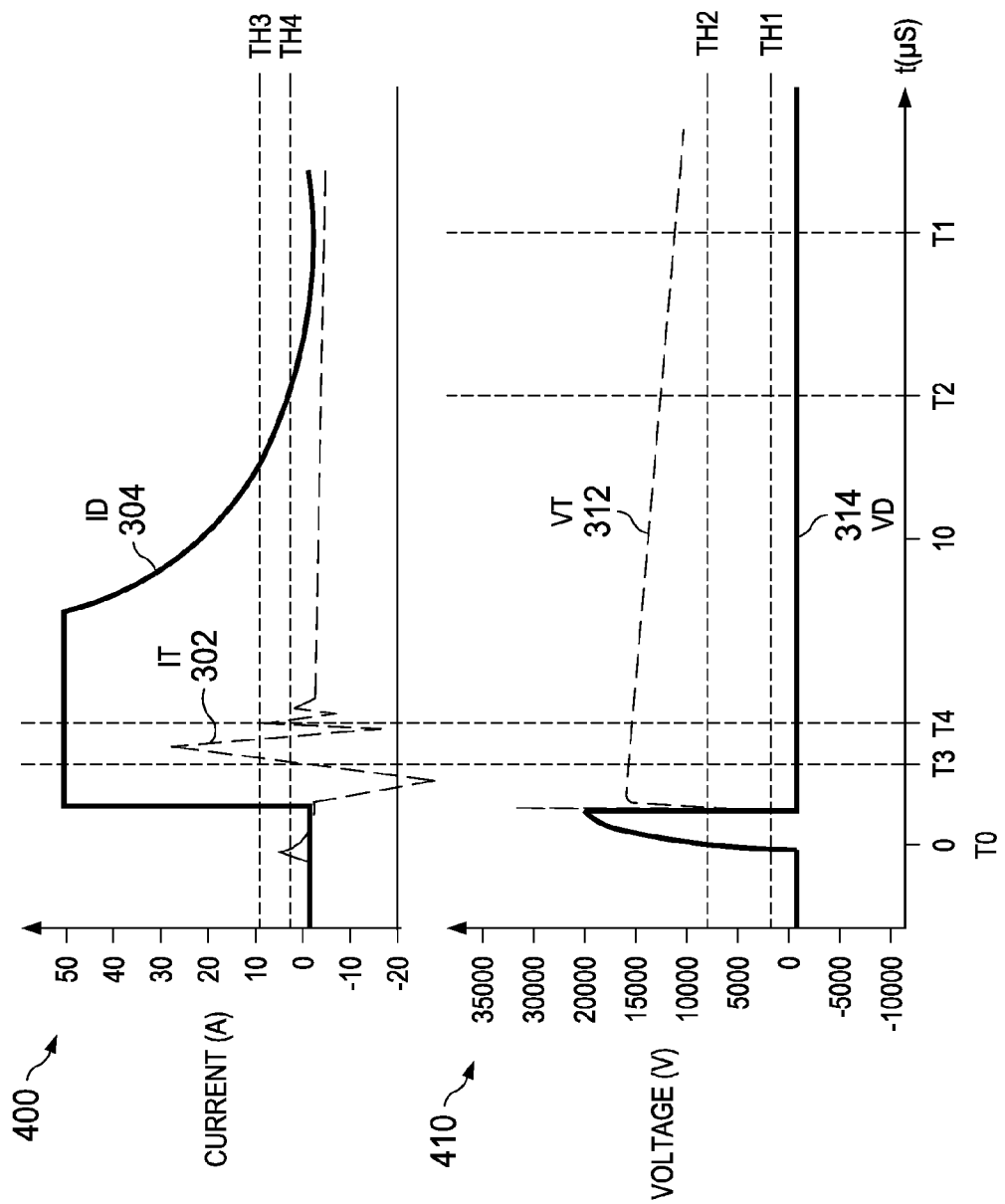
FIG. 4 is a waveform diagram of DUT and tool voltage and current waveforms for a failed DUT.
Figure 5:
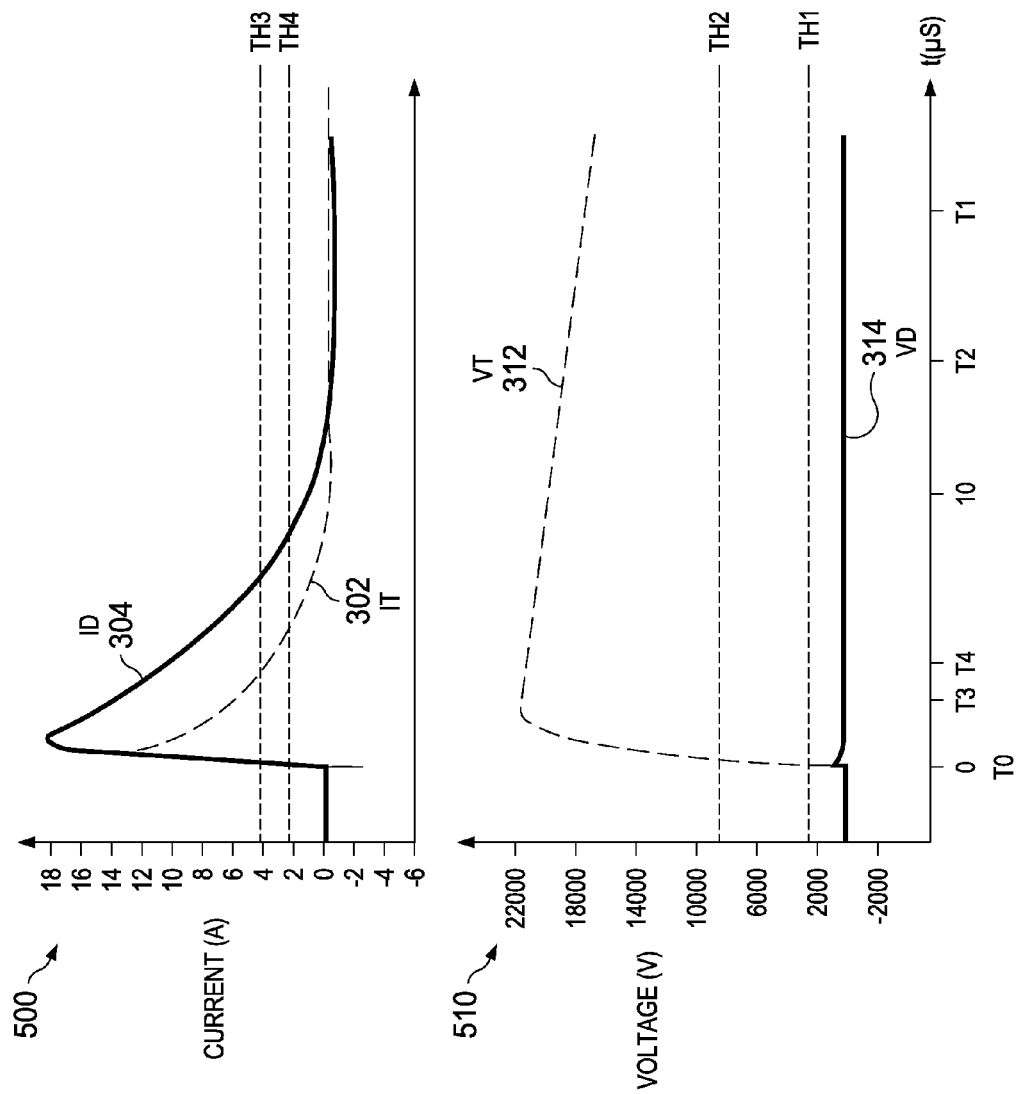
FIG. 5 is a waveform diagram of DUT and tool voltage and current waveforms for a failed DUT undergoing a subsequent pulse after a failing pulse.

Referring also to FIGS. 3-5, FIG. 3 illustrates a waveform diagram including a graph 300 of current as a function of time and a graph 310 showing voltage as a function of time for a passing DUT. A first current waveform 302 in the graph 300 shows the tool current IT representing the current flowing into or out of one of the first and second pulse output connections 126, 128 of the pulse generator tool 102 in FIG. 1. The oscilloscope 108 generates the waveform 302 according to the signal from the current output connection 132 of the pulse generator 102. The graph 300 also shows a second current waveform 304 representing the DUT current ID generated by the oscilloscope 108 according to the sensor output signal from the current sensor 114 at the test fixture 106. The graph 310 in FIG. 3 shows voltage waveforms 312 and 314 generated by the oscilloscope, including a first voltage waveform 312 representing the voltage of the high voltage pulse or tool voltage VT generated according to the pulse generator voltage output signal provided from the from the voltage output connection 134 of the pulse generator tool 102. The second voltage waveform 314 in FIG. 3 represents the DUT voltage VD, and the waveform 314 is generated by the oscilloscope 108 according to the sensor output signal from the voltage sensor 116 at the test fixture 106. The waveform diagram in FIG. 4 shows graphs 300 and 310 depicting the DUT and pulse generator tool voltage and current waveforms 302, 304, 312 and 314 for a failed DUT, and graphs 500 and 510 in the waveform diagram of FIG. 5 illustrates DUT and tool voltage and current waveforms 302, 304, 312 and 314 generated by the oscilloscope 108 for a failed DUT undergoing a subsequent pulse after a failing pulse.

In one non-limiting example, the host processor 110 receives one or more of the waveforms 302, 304, 312 and/or 314 and performs waveform analysis at 206 to selectively determine whether a corresponding DUT has passed or failed the surge test. In the example of FIG. 2, the processor 110 analyzes one or more signal waveforms at 208 corresponding to voltages and/or currents during the applied high voltage test pulse between a start time T0 and a first predetermined time T1 shown in FIGS. 3-5. In this example, moreover, the processor 110 performs various threshold comparisons at different times or portions of the applied high voltage pulse in order to selectively identify passing or failing conditions associated with the tested DUT or DUTs. In this regard, the oscilloscope 108 generates one or more waveforms 302, 304, 312, 314 as sets of data samples or digital values corresponding to or otherwise representing the associated current or voltage, and provides the waveforms 302, 304, 312 and/or 314 as groups of data to the host processor 110, where each data value corresponds to a sample time within the test pulse range T0 through T1. The processor 110 compares the values associated with the waveforms 302, 304, 312 and/or 314 at given times within the corresponding range T0 through T1 with values corresponding to one or more thresholds TH1, TH2, TH3 and TH4 in order to determine a pass or fail condition of the DUT for the applied high voltage pulse.

In one example at 210 in FIG. 2, the processor 110 selectively identifies the DUT as failing the surge test if the first and second voltage waveforms 312 and 314 are dissimilar during the applied high voltage pulse. FIG. 3 illustrates an example of a passing condition in which the VD waveform 314 is substantially similar to the VT waveform 312. This indicates that the voltage VT applied by the pulse generator tool 102 is substantially the same voltage seen by the DUT and the test fixture 106. In this case, moreover, the DUT has passed the test without significant conduction of current associated with the test pulse, with the current limiter 104 essentially remaining in a low impedance state. As further shown in the graph 300 of FIG. 3, the DUT current waveform 304 remains essentially at 0 A in the passing case, with the tool current curve 302 initially undergoing a peak or rise corresponding to charging of one or more energy storage components within the current limiter 104, without significant current flow through the DUT at the test fixture 106. In one example, the comparison of the tool and DUT voltage curves 312 and 314 by the processor 110 is done by subtracting the values of the curve 312 from the corresponding values of the curve 314, and comparing the differences to a threshold value, for example, a small percentage of the overall peak amplitude of the applied pulse. In the example of FIG. 3, a pulse of approximately 13,000 V is applied, and the processor 110 assesses the curves 312, 314 to determine whether the difference between the values of the curves 312 and 314 exceeds a small number, such as 100 V in one example. Other suitable mathematical techniques can be employed by the host processor 110 in various embodiments in order to determine whether the curves 312 and 314 are similar or dissimilar in order to determine a pass or fail condition of the DUT at 210 in FIG. 2.

FIG. 4 shows an example of the voltage waveforms 312 and 314 for a failed DUT. In this case, the tool voltage waveform 312 (VT) and the DUT voltage waveform 314 (VD) are significantly dissimilar, with the tested DUT failing between times T0 and T3 shown in FIG. 4. After this failure point, the tool voltage drops suddenly, and then recovers to approximately 1600 V before gradually decreasing between T3 and T1. At the failure point, moreover, the DUT voltage waveform 314 drops to essentially zero, indicating that the DUT has failed in a low impedance state (e.g., a short-circuit), and thus the tool voltage VT and the device voltage VD are significantly different for a large portion of the test pulse duration between T0 and T1. In this case, the host processor 110 determines at 210 that the VD and VT waveforms are dissimilar, and accordingly identifies the DUT as failing the surge test (YES at 210 in FIG. 2).

In another example of this concept, the oscilloscope 108 provides a differential voltage waveform (not shown) to the processor 110 representing a voltage difference between the tool voltage VT and the DUT voltage VD, and the processor 110 compares the data values associated with this waveform to a threshold, and determines that the corresponding DUT has failed if the differential voltage waveform exceeds the threshold. If the processor 110 determines that the VD and VT waveforms are dissimilar (YES at 210 in FIG. 2), the process 200 continues at 222 where the relevant DUT or part is identified as having failed the surge stress test pulse. In certain embodiments, the processor initiates an additional applied surge stress pulse at 224 and analyzes one or more of the waveforms 302, 304, 312 and/or 314 to verify the failure (e.g., to rule out a false failure identification), and the process 200 terminates with an identified DUT failure if verified.

As further shown in FIG. 2, the host processor 110 can perform further tests at 212, 214, 216 and 218 as part of the analysis and pass/fail condition determination at 206. In the illustrated example, the processor 110 performs multiple tests based on waveform analysis for a given applied high voltage pulse, anyone of which can lead to a determination that the DUT has failed the surge test. In other examples, the processor 110 performs fewer than all of the illustrated example tests 210, 212, 214, 216 and/or 218. In this regard, one simple implementation includes one, some or all of the tests at 210, 212 and/or 214, with the system 100 (FIG. 1) possibly being implemented with only a voltage sensor 116 and a voltage output from the pulse generator 102 using a two-channel oscilloscope 108 for waveform analysis of voltage waveforms at the tool 102 and at the DUT in the test fixture 106. In another possible setup, a single channel oscilloscope 108 is used with a voltage sensor 116 and the processor 110 performs the test 210 to selectively identify passing or failing DUTs. In other examples, the current sensor 114 is provided, and a tool current signal IT is obtained and analyzed by the oscilloscope 108 from the pulse generator tool 102 for subsequent waveform analysis by the host computer processor 110.

At 212 in FIG. 2, the processor 110 assesses the DUT voltage waveform 314 and identifies the DUT as failing if the absolute value of the DUT voltage waveform 314 is greater than a first non-zero threshold value TH1 within a first predetermined time T1 after the start T0 of the applied high voltage pulse. In one example, the first threshold value TH1 is approximately 2000 V for an applied high voltage pulse having a peak amplitude of approximately 20,000 V, although other thresholds can be used for this pass/fail determination at 212 in other embodiments. In the illustrated example, moreover, the time T1 is approximately 20 μs, although other suitable predetermined time periods can be used in other examples. As seen in the passing DUT case of FIG. 3, the VD curve 314 remains above the threshold TH1 throughout the entire relevant time period from T0 through T1. In contrast, the failed DUT case in the graph 410 of FIG. 4 shows the DUT voltage curve 314 falling below the threshold TH1 between T0 and T3 and remaining essentially at 0 V until the end of the relevant period at T1. Accordingly, the host processor 110 in this case identifies the DUT as failing (YES at 212 in FIG. 2), and the process 200 proceeds to 222 and optionally 224 as described above.

If the DUT passes the above described tests (NO at 210 and NO at 212), the method 200 continues at 214 where the host processor 110 analyzes the tool voltage curve 312 with respect to a second non-zero threshold TH2. In this waveform analysis test, the processor 110 selectively identifies the DUT as failing (YES at 214) if the absolute value of the tool voltage waveform 312 (VT) is less than the threshold value TH2 within a second predetermined time T2 after the start of the applied high voltage pulse at T0. In one example, the second threshold voltage value TH2 is approximately 8000 V, and the second time T2 is approximately 15 μs. Other threshold values TH2 and second predetermined time values T2 can be used in other embodiments. The tool voltage curve 312 in the passing case example of FIG. 3 remains above the second threshold value TH2 until well after the predetermined time T2. In contrast, the failed DUT case of FIG. 4 illustrates the tool voltage curve 312 (VT) falling below the second threshold value TH2 due to the DUT failing between T0 and T3. In response to determining this condition (YES at 214 in FIG. 2), the host processor 110 identifies the DUT as failing, and the method 200 proceeds to 222 and 224 as previously described.

If the DUT passes the above described tests (NO at 210, 212 and 214), the method 200 continues at 216 in FIG. 2, where the host processor 110 analyzes the tool current curve 302 (IT) with respect to a third non-zero threshold value TH3 after the third predetermined time T3 in FIGS. 3-5. In one non-limiting example, the third threshold value is approximately 10 A and the third predetermined time is approximately 3 μs, although any suitable threshold TH3 and time value T3 can be used in other embodiments. At 216, the processor 110 selectively identifies the DUT as failing (YES at 216) if the absolute value of the tool current waveform 302 (TT) is greater than TH3 after T3, thus indicating excessive tool current after the initial charge up current drawn by the current limiter 104. As seen in the passing DUT case of FIG. 3, the tool current curve 302 initially rises at the start of the test pulse, and then falls to approximately zero before T3. For the failed DUT example in FIG. 4, however, the tool current curve 302 oscillates after device failure, including excessive current rise to approximately 26 A between T3 and a fourth time period T4. In this case, the processor 110 identifies the excessive current after T3 and accordingly identifies the DUT as having failed the surge test (YES at 216), with the process 200 of FIG. 2 proceeding thereafter to 222 and 224 as described above.

If the DUT passes the test set 210-216, the method 200 in FIG. 2 continues at 218 where the host processor 110 analyzes the second current waveform 304 corresponding to the DUT current ID. In this case, the processor 110 identifies the DUT as failing (YES at 218) if the absolute value of the DUT current waveform 304 is greater than a fourth non-zero threshold value TH4 after T4 (i.e., more than T4 after the start of the applied high voltage pulse at T0). For a passing DUT example as shown in FIG. 3, the DUT current ID essentially remains at zero throughout the relevant time period from T0 through T1. If the device fails, however, the DUT current waveform 304 is nonzero as the device fails to a low impedance state, where the curve 304 in FIG. 4 exceeds the fourth threshold value TH4 at T4 and for a significant time thereafter. In this case, the processor 110 determines at 218 that the DUT has failed (YES at 218), and the method 200 continues at 222 and 224 as previously described.

In the example of FIG. 2, the method 200 may be repeated for any suitable number of pulses, with the processor determining at 220 that the DUT has passed the current test pulse (NO at 210-218), and returning for any further pulses at 202-218. In one example, the processor 110 implements a series of 25 positive pulses and 25 negative pulses using the process 200 for each DUT or set of multiple DUTs, and if none of the waveform analysis test fails (NO at 210-218), the process 200 is completed and the DUT or set of multiple DUTs can be removed from the test fixture 106 in FIG. 1.

Referring also to FIG. 5, the processor 110 may perform the test process 200 of FIG. 2 with each test being passed, although one or more of the waveforms 302, 304, 312 and/or 314 may deviate from a predetermined waveform profile associated with a passing device. In this regard, the host processor 110 may accumulate waveforms over time corresponding to passing devices and/or may implement a learning process to characterize a known passing device, and store one or more exemplary passing curves corresponding to voltages and/or currents associated with the pulse generator tool 102 and/or the signals at the test fixture 106. In one example, the processor 110 selectively identifies a DUT or set of DUTs as potentially failing if one or more of the test waveforms 302, 304, 312, 314 deviate significantly from the corresponding exemplary passing curve.

As further shown in FIG. 2, the processor 110 may terminate the test procedure 200 after any one of the tests fails (NO at 210, 212, 214, 216 or 218), and identify the corresponding DUT as failed. In one example, moreover, the processor 110 can perform in situ verification for a suspected failing DUT by initiating one or more additional surge stress test pulses at 224, followed by waveform analysis of the corresponding voltage and/or current waveforms (e.g., 302, 304, 312 and/or 314) as described above. FIG. 5 illustrates graphs 500 and 510 respectively showing current waveforms and voltage waveforms for the pulse generator tool 102 and the DUT in the test fixture 106 corresponding to an example failed DUT for a test pulse applied after a failing pulse. In this case, the DUT has undergone a test pulse as described above at 202-218, and has undergone a failure (e.g., low impedance or short circuit failure) during the test pulse. The curves 302, 304, 312 and 314 in FIG. 5 show the failed DUT performance in a subsequent high voltage applied pulse, referred to as a "pulse after failed pulse". In this case, the tool current curve 302 rises at T0 in the normal fashion, but continues rising to a higher level (e.g., approximately 14 A in this example), and then slowly decreases back to zero through operation of the current limiter 104. As further shown in the graph 500, the device current waveform 304 also rises at T0 and reaches a fairly high value (e.g., 18 A in this example), before also decreasing through operation of the current limiter 104. In the graph 510 of FIG. 5, the pulse generator tool voltage curve 312 rises according to the IEC pulse waveform profile as expected, but the DUT voltage undergoes an initial voltage rise as the current limiter 104 begins operation, and then the DUT voltage VD shown by the curve 314 decreases back to zero since the failed DUT is essentially short-circuited. This "pulse after failing pulse" test can be implemented at 224 in FIG. 2 in order to verify a previous indication (YES at 210, 212, 214, 216 or 218) in order to further mitigate or avoid false positives regarding failure identification.

The system 100 and method 200 described above facilitate high voltage surge testing with robust identification of truly failed parts, while mitigating or avoiding the previous problems associated with uncertainty using Ipeak or other metrics or values generated by the pulse generator equipment 102. The above-described techniques and systems, moreover, are easily adapted to different pulse generator equipment 102 and different testing parameters associated with the applied high-voltage test pulse. The increased reliability, moreover, and in particular the option for in situ verification at 224 in FIG. 2, mitigate or avoid the prior requirements for having external (off-line) verification test equipment and procedures, and thus make the system and method desirable for in-line production testing. Moreover, the streamlined automated testing can be applied for batch testing and/or full 100% testing of production parts, thereby facilitating high reliability part production yield with high confidence.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. An automated testing system, comprising:
a pulse generator, including first and second pulse output connections to provide a high voltage pulse, and a voltage output connection to provide a pulse generator voltage output signal representing a voltage of the high voltage pulse;
a current limiter including first and second current limiter input connections connected to the first and second pulse output connections of the pulse generator, and first and second current limiter output connections, the current limiter operative to limit current flowing between the current limiter input connections and the first and second current limiter output connections;
a test fixture including a first test fixture connection connected to the first current limiter output connection, a second test fixture connection connected to the second current limiter output connection, and at least one socket coupled with the first and second test fixture connections to support and electrically connect a device under test (DUT);
a voltage sensor to provide a voltage sensor output signal representing a DUT voltage;
an oscilloscope coupled with the pulse generator and the voltage sensor, the oscilloscope operative to generate a first voltage waveform representing the voltage of the high voltage pulse according to the pulse generator voltage output signal, and to generate a second voltage waveform representing the DUT voltage according to the voltage sensor output signal; and
a host processor operatively coupled to receive the first and second voltage waveforms from the oscilloscope, the host processor being programmed to determine a pass or fail condition of the DUT for an applied high voltage pulse according to the first and second voltage waveforms.

2. The system of claim 1, further comprising a current sensor operatively coupled with the oscilloscope to provide a current sensor output signal representing a DUT current flowing in one of the first and second test fixture connections;
wherein the pulse generator includes a current output connection to provide a pulse generator current output signal representing a current flowing in one of the first and second pulse output connections;
wherein the oscilloscope is operative to generate a first current waveform representing the current flowing in one of the first and second pulse output connections according to the pulse generator current output signal, and to generate a second current waveform representing the DUT current according to the current sensor output signal; and
wherein the host processor is operative to receive the first and second current waveforms from the oscilloscope, and to determine the pass or fail condition of the DUT according to at least one of the first and second current waveforms.

3. The system of claim 2, wherein the host processor is programmed to identify the DUT as failing if the first and second voltage waveforms are dissimilar during the applied high voltage pulse.

4. The system of claim 3, wherein the host processor is programmed to identify the DUT as failing if an absolute value of the second voltage waveform is greater than a first non-zero threshold value within a first predetermined time after a start of the applied high voltage pulse.

5. The system of claim 4, wherein the host processor is programmed to identify the DUT as failing if an absolute value of the first current waveform is greater than a third non-zero threshold value more than a third predetermined time after the start of the applied high voltage pulse.

6. The system of claim 5, wherein the host processor is programmed to identify the DUT as failing if an absolute value of the second current waveform is greater than a fourth non-zero threshold value more than a fourth predetermined time after the start of the applied high voltage pulse.

7. The system of claim 4, wherein the host processor is programmed to identify the DUT as failing if an absolute value of the first voltage waveform is less than a second non-zero threshold value within a second predetermined time after the start of the applied high voltage pulse.

8. The system of claim 2, wherein the host processor is programmed to identify the DUT as failing if an absolute value of the first current waveform is greater than a third non-zero threshold value more than a third predetermined time after a start of the applied high voltage pulse.

9. The system of claim 2, wherein the host processor is programmed to identify the DUT as failing if an absolute value of the second current waveform is greater than a fourth non-zero threshold value more than a fourth predetermined time after a start of the applied high voltage pulse.

10. The system of claim 1, wherein the host processor is programmed to identify the DUT as failing if the first and second voltage waveforms are dissimilar during the applied high voltage pulse.

11. The system of claim 1, wherein the host processor is programmed to identify the DUT as failing if an absolute value of the second voltage waveform is greater than a first non-zero threshold value within a first predetermined time after a start of the applied high voltage pulse.

12. The system of claim 1, wherein the host processor is programmed to identify the DUT as failing if an absolute value of the first voltage waveform is less than a second non-zero threshold value within a second predetermined time after a start of the applied high voltage pulse.

13. The system of claim 1, wherein the host processor is programmed to control the pulse generator to provide the applied high voltage pulse to the DUT, and wherein the host processor is programmed to control the oscilloscope to obtain the waveforms during the applied high voltage pulse.

14. A method of surge testing a device under test (DUT), the method comprising:

using at least one processor, receiving from an oscilloscope, at least one waveform corresponding to an applied high voltage pulse, the at least one waveform representing a voltage or current associated with at least one of a DUT and a pulse generator during the applied high voltage pulse;

using the at least one processor, analyzing the at least one waveform wherein said at least one waveform includes a first voltage waveform and a second voltage waveform; and using the at least one processor, identifying the DUT as failing by determining that the first voltage waveform representing a voltage of the applied high voltage pulse and the second voltage waveform representing a DUT voltage during the applied high voltage pulse are dissimilar.

15. The method of claim 14, further comprising, using a current limiter:

during the applied high voltage pulse, preventing an overcurrent condition in a test fixture delivering the high voltage pulse to the DUT.

16. A non-transitory computer readable medium with computer executable instructions for surge testing a device under test (DUT), the computer readable medium comprising computer executable instructions for:

receiving from an oscilloscope, at least one waveform corresponding to an applied high voltage pulse, the at least one waveform representing a voltage or current associated with at least one of a device under test (DUT) and a pulse generator during the applied high voltage pulse;

analyzing the at least one waveform wherein said at least one waveform includes a first voltage waveform and a second voltage waveform; and identifying the DUT as failing if the first voltage waveform representing a voltage of the applied high voltage pulse and the second voltage waveform representing a DUT voltage during the applied high voltage pulse are dissimilar.

17. The non-transitory computer readable medium of claim 16, wherein the computer readable medium further comprises computer executable instructions for:

identifying the DUT as failing if an absolute value of the second voltage waveform representing the DUT voltage during the applied high voltage pulse is greater than a non-zero threshold value within a predetermined time after a start of the applied high voltage pulse.

18. The non-transitory computer readable medium of claim 16, wherein the computer readable medium further comprises computer executable instructions for:

identifying the DUT as failing if an absolute value of the first voltage waveform representing the voltage of the applied high voltage pulse is less than a non-zero threshold value within a predetermined time after a start of the applied high voltage pulse.

19. The non-transitory computer readable medium of claim 16, wherein the computer readable medium further comprises computer executable instructions for:

identifying the DUT as failing if an absolute value of a current waveform representing a current flowing in a pulse generator is greater than a non-zero threshold value more than a predetermined time after a start of the applied high voltage pulse.

20. The non-transitory computer readable medium of claim 16, wherein the computer readable medium further comprises computer executable instructions for:

identifying the DUT as failing if an absolute value of a current waveform representing the current flowing in the DUT during the applied high voltage pulse is greater than a non-zero threshold value more than a predetermined time after a start of the applied high voltage pulse.

* * * * *